(12) United States Patent
Kang

(10) Patent No.: US 6,222,385 B1
(45) Date of Patent: Apr. 24, 2001

(54) LEVEL SHIFTER CIRCUIT

(75) Inventor: Hun Sik Kang, Daejeon-si (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/371,837

(22) Filed: Aug. 11, 1999

(30) Foreign Application Priority Data

Jan. 12, 1999 (KR) ..................................................... 99/567

(51) Int. Cl.$^7$ .................. H03K 19/094; H03K 19/0175
(52) U.S. Cl. ................................................. 326/68; 326/63
(58) Field of Search ................................. 326/68, 62, 63, 326/81, 70, 71

(56) References Cited

U.S. PATENT DOCUMENTS

| | | | |
|---|---|---|---|
| 4,380,710 | 4/1983 | Cohen et al. ......................... | 307/475 |
| 4,504,747 | * 3/1985 | Smith et al. .......................... | 307/475 |
| 5,332,935 | * 7/1994 | Shyu ...................................... | 307/475 |
| 5,341,047 | 8/1994 | Rosenthal .............................. | 307/478 |
| 5,723,986 | * 3/1998 | Nakashiro et al. .................... | 326/81 |
| 5,739,700 | * 4/1998 | Martin .................................... | 326/80 |
| 5,892,371 | * 4/1999 | Maley .................................... | 326/81 |
| 5,929,656 | * 7/1999 | Pagones ................................ | 326/83 |
| 6,023,175 | * 2/2000 | Nunomiya et al. .................... | 326/68 |

* cited by examiner

Primary Examiner—Michael Tokar
Assistant Examiner—Daniel D. Chang
(74) Attorney, Agent, or Firm—Fleshner & Kim, LLP

(57) ABSTRACT

Level shifter circuit which can make an efficient level shift to level up or level down according to a change of a digital logic characteristic, including a comparator for comparing an up/down control signal to a reference signal in disabling either one of the level up shifter or the level down shifter according to the up/down control signal, a level up shifter unit for leveling up of an input voltage in response to a level up shifter/level down shifter disable signal from the comparator, a level down shifter unit for leveling down of an input voltage in response to a level up shifter/level down shifter disable signal from the comparator; and an analog multiplexer for selectively providing a leveled up signal or a leveled down signal from the level up shifter unit or the level down shifter unit.

19 Claims, 4 Drawing Sheets

* ΔV CONTROLLABLE ACCORDING TO AN OUTPUT FROM COMPARATOR

\* ΔV CONTROLLABLE ACCORDING TO AN OUTPUT FROM COMPARATOR

US 6,222,385 B1

LEVEL SHIFTER CIRCUIT

BACKGROUND OF THE INVENTION

1. Field of the Invention

The present invention relates to a level shifter, and more particularly, to a level shifter circuit which can make an efficient level shift to level up or level down according to a change of a digital logic characteristic.

2. Background of the Related Art

Either level up or down by the level shifter is determined according to a digital logic of the level shifter input/output, according to which a level shifter circuit is designed. A related art level shifter will be explained with reference to the attached drawings. FIG. 1 illustrates a system of a related art level shifter circuit, and FIG. 2 illustrates a graph showing a related art voltage transfer characteristic.

Referring to FIG. 1, the related art level shifter is provided with a first NMOS transistor MNI having a gate for receiving a digital logic signal, an inverter buffer INI for receiving the digital logic signal and determining an output switching point for the digital logic signal, a second NMOS transistor MN2 having a gate for receiving an output from the inverter buffer IN1, and a first and a second PMOS transistors MP1 and MP2 having gates for receiving outputs from drains of the first and second NMOS transistors MN1 and MN2 serving as active loads for the first and second NMOS transistors MN1 and MN2.

The operation of the related art level shifter will be explained. The operation of the level shifter can be known efficiently when a state of an output voltage Vout, i.e., an output state of an input voltage Vin provided to a gate of the first NMOS transistor MN1 after being swept is reviewed. That is, the voltage transfer characteristics are as follows.

Referring to FIG. 2, when the input voltage Vin is at low, the output voltage is also at low. In this state, if the input voltage is increased, a Vgs of the first NMOS MN1 is increased, causing a current flowing through the first NMOS transistor MN1 to increase. Though the current flowing through the first NMOS transistor MN1 is increased, the output voltage shows no substantial increase compared to a prior voltage. There is no substantial increase in the output voltage Vout because an output from the inverter buffer IN1 shows no substantial change if an input to the inverter buffer IN1 is increased over the low level(a level of the Vin received presently), which output is connected to the gate of the second NMOS transistor MN2 thereby causing no substantial change in the current flowing through the second NMOS transistor NM2. If the input keeps increasing from this state to a state higher than the low level but lower than a high level, the inverter buffer IN1 is operative in a transition region, decreasing the current flowing through the second NMOS transistor MN2. If the current flowing through the second NMOS transistor MN2 is decreased, the Vgs voltage of the second NMOS transistor MN2 is lowered to boost the output voltage Vout. That is, the decrease of Vgs of the first PMOS transistor MP1 further decreases the current flowing through the first PMOS transistor MP1, that further decreases a voltage between the drain-source of the first NMOS transistor MN1. When this case is occurred, the current flowing through the second PMOS transistor MP2 is further increased, accelerating increase of the output voltage faster to a high voltage. Thus, the first PMOS transistor MP1 and the second PMOS transistor MP2 vary output voltage levels with logic state changes of the input voltage Vin in the level shifter circuit.

However, the related art level shifter circuit has the following problem because level up or down is determined according to a digital logic of the level shifter input/output, according to which the level shifter circuit is designed. That is, if input and output digital logic characteristic is changed from a level up to a level down or vice versa, the present level up shifter(or a level down shifter) should be re-designed.

SUMMARY OF THE INVENTION

Accordingly, the present invention is directed to a level shifter circuit that substantially obviates one or more of the problems due to limitations and disadvantages of the related art.

An object of the present invention is to provide a level shifter circuit which can make an efficient level shift operation to level up or level down according to a change of a digital logic characteristic.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the level shifter circuit, for making an efficient level shift to level up or level down according to a change of a digital logic characteristic, includes a comparator for comparing an up/down control signal to a reference signal in disabling either one of the level up shifter or the level down shifter according to the up/down control signal, a level up shifter unit for leveling up of an input voltage in response to a level up shifter/level down shifter disable signal from the comparator, a level down shifter unit for leveling down of an input voltage in response to a level up shifter/level down shifter disable signal from the comparator; and an analog multiplexer for selectively providing a leveled up signal or a leveled down signal from the level up shifter unit or the level down shifter unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
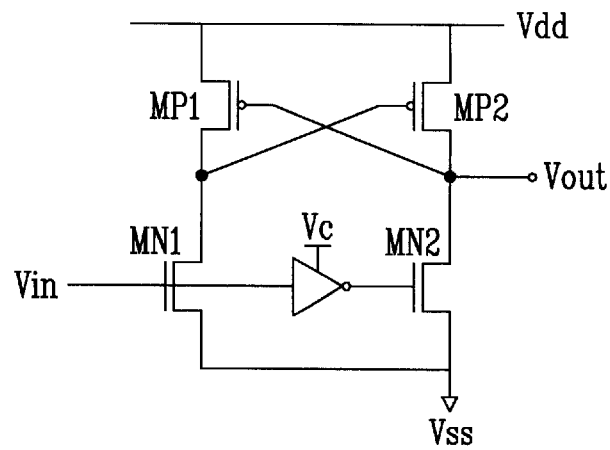
FIG. 1 illustrates a system of a related art level shifter circuit.
Figure 2:
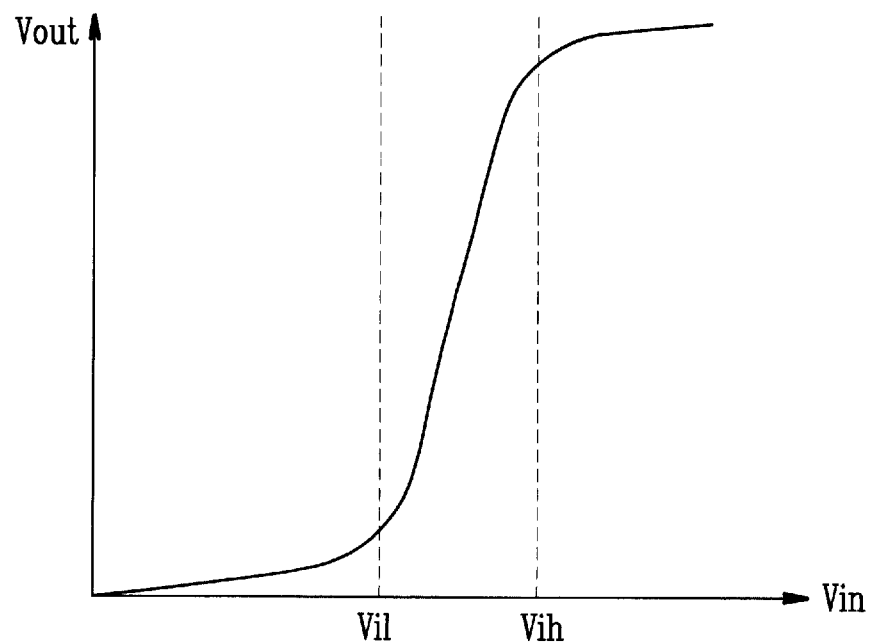
FIG. 2 illustrates a graph showing a related art voltage transfer characteristic.
Figure 3:
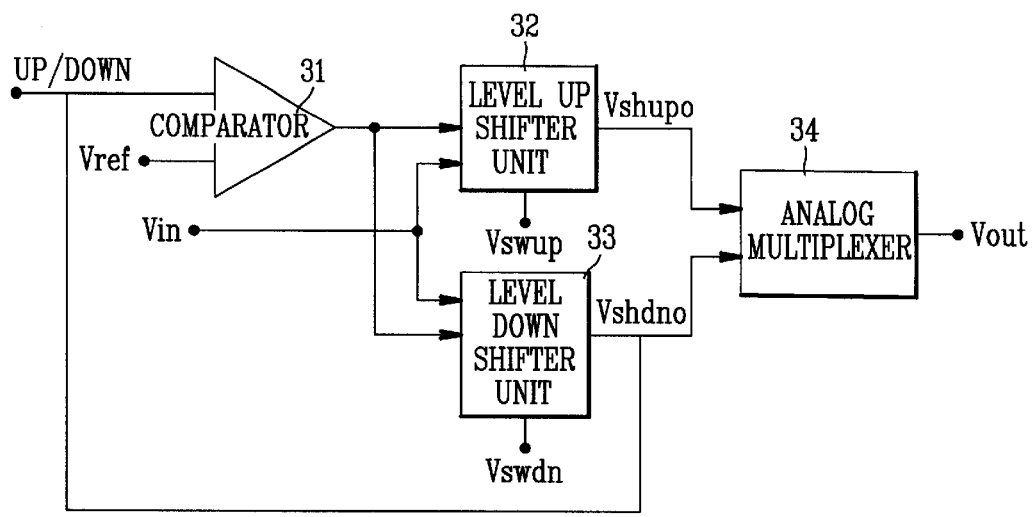
FIG. 3 illustrates a system of a level shifter circuit in accordance with a preferred embodiment of the present invention.

Reference will now be made in detail to the preferred embodiments of the present invention, examples of which are illustrated in the accompanying drawings. FIG. 3 illustrates a system of a level shifter circuit in accordance with a preferred embodiment of the present invention.

Referring to FIG. 3, the level shifter circuit in accordance with a preferred embodiment of the present invention includes a comparator 31, a level up shifter unit 32, a level down shifter unit 33, and analog multiplexer 34, i.e., a comparator 31 for comparing an up/down control signal to a reference signal Vref in disabling either one of the level up shifter or the level down shifter according to the up/down control signal, a level up shifter unit 32 for level up of an input voltage Vin in response to a level up shifter/level down shifter disable signal from the comparator 31, a level down shifter unit 33 for level down of an input voltage Vin in response to a level up shifter/level down shifter disable signal from the comparator 31, and an analog multiplexer 34 for selectively providing a leveled up signal or a leveled down signal from the level up shifter unit 32 or the level down shifter unit 33.

Figure 4:
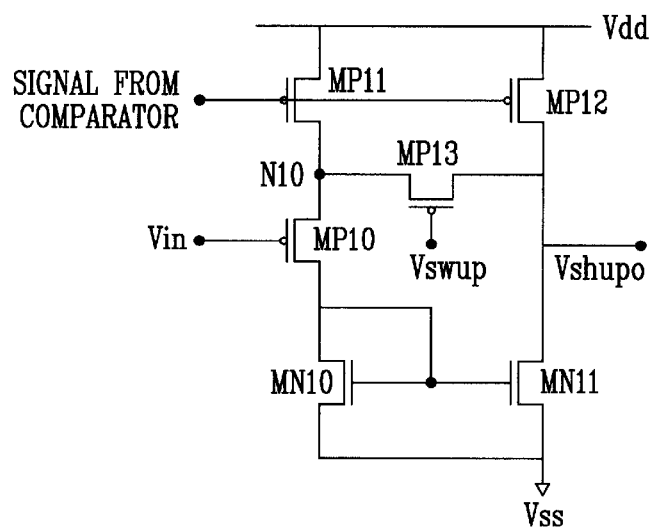
FIG. 4 illustrates a detailed system of a level up shifter unit in accordance with a preferred embodiment of the present invention.
Figure 5:
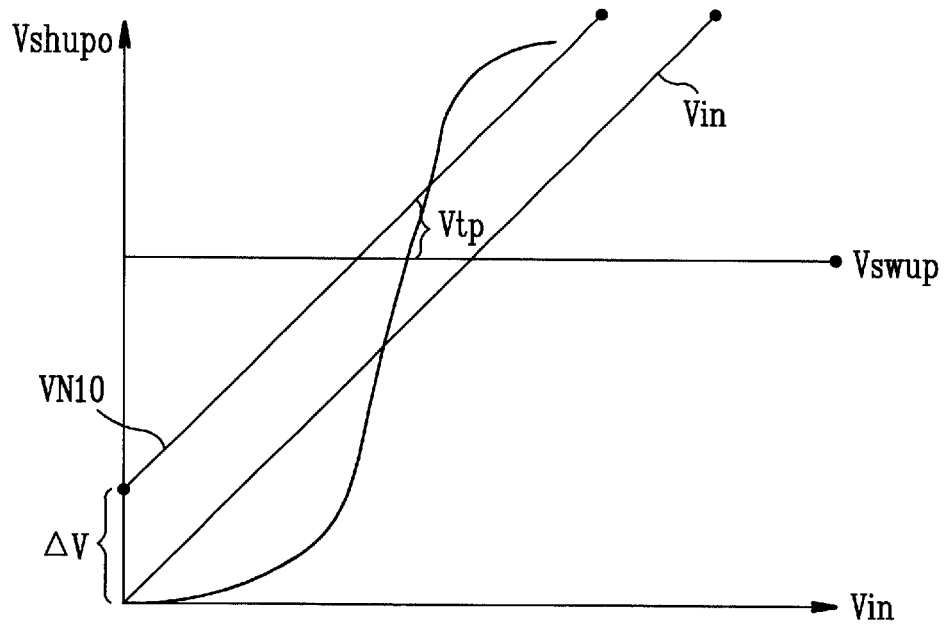
FIG. 5 illustrates a graph showing a voltage transfer characteristic of the level up shifter unit of the present invention.

Detailed systems of the blocks in the aforementioned level shifter circuit of the present invention will be explained. FIG. 4 illustrates a detailed system of a level up shifter unit in accordance with a preferred embodiment of the present invention, and FIG. 5 illustrates a graph showing a voltage transfer characteristic of the level up shifter of the present invention.

Referring to FIG. 4, the level up shifter unit 32 in accordance with a preferred embodiment of the present invention includes a first PMOS transistor MP10 having a gate for receiving the input voltage Vin, a second and a third PMOS transistors MP11 and MP12 each having a source for having a power source Vdd applied thereto and a gate for receiving the level up shifter disable signal from the comparator 31, a fourth PMOS transistor MP13 having a gate for having a signal Vswup which determines a level up switching point applied thereto, a source connected to a drain of the second PMOS transistor MP11, and a drain connected to an output terminal Vshupo in common with a drain of the third PMOS transistor MP12 for determining a switching point of the level up shifter, and a first and a second NMOS transistors MN10 and MN11 each having a gate connected to a drain of the first PMOS transistor MP10 in common, a drain respectively connected to the drain of the first PMOS transistor MP10 and an output terminal Vshupo, and a source connected to a ground terminal. The first PMOS transistor MP10 having the input voltage Vin applied to the gate thereof serves as a voltage follower. The second and third PMOS transistors MP11 and MP12 and the first and second NMOS transistors MN10 and MN11 serve as current source sinks for assuring a function of the voltage follower.

The level up operation of the aforementioned level shifter circuit in accordance with a preferred embodiment of the present invention will be explained.

Upon reception of an up/down control signal which determines a level up/level down of the input voltage, the comparator 31 compares the up/down control signal to the reference signal Vref and provides a voltage lower than the Vref if it is a level up case and higher than the Vref if it is a level down case. The voltage from the comparator 31 which is provided for determining an extent of difference of the input voltage from a shifted voltage in the operation of the shifter circuit in either level up or level down mode controls a level up or down current. When the voltage from the comparator is the level up case, the fourth and fifth NMOS transistors MN13 and MN14 in the level down shifter unit 33 are turned off to cut off a current to the level down shifter unit 33, to block a level down function. A current is supplied to the level up shifter unit 32 to cause, and sustain a difference of a voltage at the source terminal of the first PMOS transistor MP10 from the input voltage Vin. Under this condition, if a voltage at the node 10 N10 goes higher than a voltage Vswup which determines a switching point of the level up shifter unit 32, a level of the voltage Vshupo from the level up shifter unit 32 is changed to make a switching according to a digital logic characteristic of the input voltage Vin. The voltage Vshupo from the level up shifter unit 32 provided thus is selected, and presented finally by the up/down control signal provided to a selector terminal on the analog multiplexer 34.

FIG. 5 illustrates a graph showing a voltage transfer characteristic of the level up shifter unit of the present invention, wherein a relation between the input voltage Vin and the output voltage Vshupo to/from the level up shifter unit 32 according to the voltage at the node 10 and the voltage Vswup which determines a switching point is shown.

Figure 6:
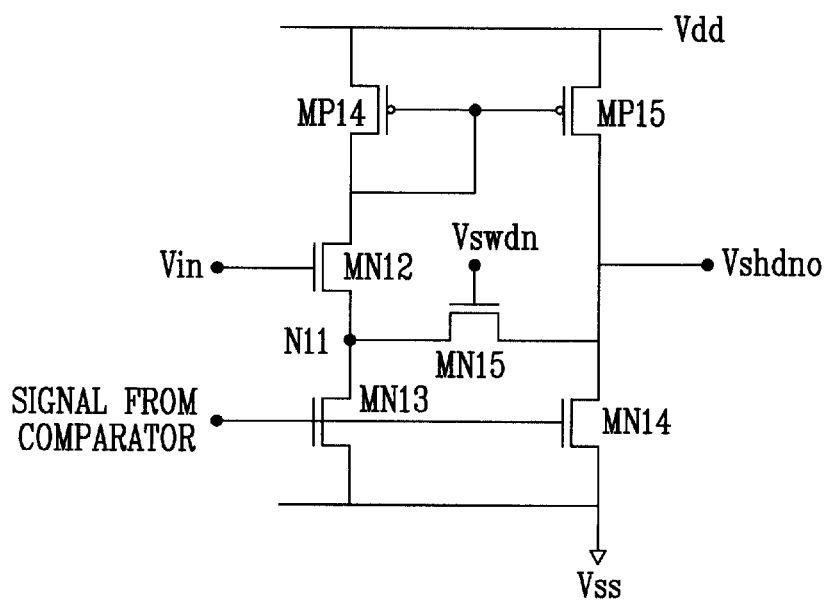
FIG. 6 illustrates a detailed system of a level down shifter unit in accordance with a preferred embodiment of the present invention; and, FIG. 7 illustrates a graph showing a voltage transfer characteristic of the level down shifter of the present invention.
Figure 7:
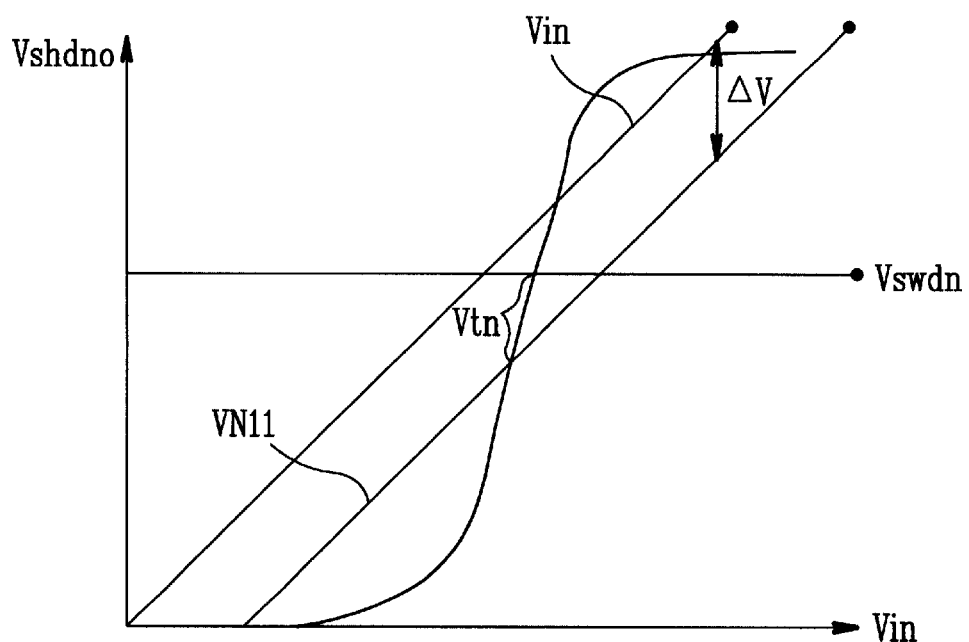

A detailed system of the level down shifter 33 in accordance with a preferred embodiment of the present invention will be explained. FIG. 6 illustrates a detailed system of a level down shifter unit in accordance with a preferred embodiment of the present invention, and FIG. 7 illustrates a graph showing a voltage transfer characteristic of the level down shifter of the present invention.

Referring to FIG. 6, the level down shifter unit in accordance with a preferred embodiment of the present invention includes a third NMOS transistor MN12 having a gate with an input voltage Vin provided thereto, a fourth and a fifth NMOS transistors MN13 and MN14 each having a source with a ground voltage Vss applied thereto and a gate with a level down shifter disable signal from the comparator 31 provided thereto, a sixth NMOS transistor MN15 having a gate with a signal Vswdn which determines a level down switching point applied thereto, a source connected to a drain of the third NMOS transistor MN12, and a drain connected to an output terminal Vshdno in common with a drain of the fifth NMOS transistor MN14 for determining a switching point of the level down shifter, and a fifth and a sixth PMOS transistors MP14 and MP15 having gates connected to a source of the third NMOS transistor MN12 in common, drains respectively connected to a drain of the third NMOS transistor MN12 and the output terminal, and sources connected to a power source terminal Vdd. The third NMOS transistor MN12 having the input voltage Vin applied to the gate thereof serves as a voltage follower. The fourth and fifth NMOS transistors MN13 and MN14 and the fifth and sixth PMOS transistors MP14 and MP15 serve as current source sinks for assuring a function of the voltage follower.

The level down operation of the aforementioned level shifter circuit in accordance with a preferred embodiment of the present invention will be explained.

Upon reception of an up/down control signal which determines a level up/level down of the input voltage, the comparator 31 compares the up/down control signal to the reference signal Vref and provides a voltage lower than the Vref if it is a level up case and higher than the Vref if it is a level down case. The voltage from the comparator 31 which is provided for determining an extent of difference of the input voltage from a shifted voltage in the operation of the shifter circuit in either level up or level down mode controls a level up or down current. When the voltage from the comparator 31 is the level down case, the second and third PMOS transistors MP11 and MP12 in the level up shifter unit 32 are turned off to cut off a current to the level up shifter unit 32, to block a level up function. A current is supplied to the level down shifter unit 33 to cause a state in which a voltage at the node 11 N11 has a difference from the input voltage Vin, and, if the voltage at the node 11 N11 goes lower than a voltage Vswdn which determines a switching point of the level down shifter unit 33 by a threshold voltage of the sixth NMOS transistor MN15, the sixth NMOS transistor MN15 is turned on to change a level of the output voltage Vshdno from the level down shifter unit 33. The voltage Vshdno from the level down shifter unit 33 provided thus is selected, and presented finally by the up/down control signal provided to a selector terminal on the analog multiplexer 34.

FIG. 7 illustrates a graph showing a voltage transfer characteristic of the level down shifter unit of the present invention, wherein a relation between the input voltage Vin and the output voltage Vshdno to/from the level down shifter unit 33 according to the voltage at the node 11 and the voltage Vswdn which determines a switching point is shown.

Thus, the level shifter circuit of the present invention requires no new level shifter circuit even if an input and output digital logic characteristic is changed from level up to level down or vice versa.

The level shifter circuit of the present invention has a high versatility for digital logic characteristic changes because the level shifter circuit requires no new level shifter circuit even if an input and output digital logic characteristic is changed from level up to level down or vice versa.

It will be apparent to those skilled in the art that various modifications and variations can be made in the level shifter circuit of the present invention without departing from the spirit or scope of the invention. Thus, it is intended that the present invention cover the modifications and 0variations of this invention provided they come within the scope of the appended claims and their equivalents.

What is claimed is:

1. A level shifter circuit comprising:
   a comparator for comparing an up/down control signal to a reference signal to output a level up shifter/level down shifter disable signal according to the up/down control signal;
   a level up shifter unit for leveling up of an input voltage in response to the level up shifter/level down shifter disable signal from the comparator;
   a level down shifter unit for leveling down of the input voltage in response to the level up shifter/level down shifter disable signal from the comparator, wherein the level up shifter/level down shifter disable signal disables one of the level up shifter unit or the level down shifter unit; and,
   a multiplexer for selectively providing a leveled up signal or a leveled down signal from the level up shifter unit or the level down shifter unit, wherein the comparator compares the up/down control signal to the reference signal and provides a voltage lower than the reference signal if it is a level up case and a voltage higher than the reference voltage if it is a level down case.

2. A level shifter circuit as claimed in claim 1, wherein the level up shifter unit includes;
   a first PMOS transistor having a gate for receiving the input voltage,
   a second and a third PMOS transistors each having a source for having a power source applied thereto and a gate for receiving the level up shifter disable signal,
   a fourth PMOS transistor having a gate for having a signal which determines a level up switching point applied thereto, a source connected to a drain of the second PMOS transistor, and a drain connected to an output terminal in common with a drain of the third PMOS transistor for determining a switching point of the level up shifter, and
   a first and a second NMOS transistors having gates connected to a drain of the first PMOS transistor in common, drains respectively connected to the drain of the first PMOS transistor and an output terminal, and sources connected to a ground terminal.

3. A level shifter circuit as claimed in claim 1, wherein the level down shifter unit includes;
   a first transistor having a gate with the input voltage provided thereto,
   second and third transistors each having a source with a ground voltage applied thereto and a gate with a level down shifter disable signal from the comparator provided thereto,
   a fourth transistor having a gate with a signal which determines a level down switching point applied thereto, a source connected to a drain of the second transistor, and a drain connected to an output terminal in common with a drain of the third transistor for determining a switching point of the level down shifter, and
   a fifth and a sixth transistors having gates connected to a drain of the first transistor in common, drains respectively connected to the drain of the first transistor and the output terminal, and sources connected to a power source terminal.

4. A level shifter circuit as claimed in claim 1, wherein the up/down control signal determines a level up/level down of the input voltage.

5. A level shifter circuit as claimed in claim 4, wherein, when the voltage from the comparator is the level up case, first and second transistors in the level down shifter unit are turned off to cut off a current to the level down shifter unit, to block a level down function.

6. A level shifter circuit as claimed in claim 4, wherein, when the voltage from the comparator is the level down case, first and second transistors in the level up shifter unit are turned off to cut off a current to the level up shifter unit, to block a level up function.

7. A level shifter circuit, comprising:
   a comparator that compares a first control signal to a reference signal to generate a second control signal according to the first control signal;
   a first voltage shifter that levels up an input voltage in response to the second control signal from the comparator;
   a second voltage shifter that levels down the input voltage in response to the second control signal from the comparator; and a selector that selectively provides a leveled up signal or a leveled down signal from the first voltage shifter or the second voltage shifter, wherein the first voltage shifter comprises,
- a first transistor that has a control electrode that receives the input voltage,
- a fourth transistor that has a control electrode that receives a third control signal that determines a switching point of the first voltage shifter, a first electrode coupled to a first electrode of the first transistor, and a second electrode coupled to an output terminal, and
- fifth and sixth transistors having control electrodes coupled to a second electrode of the first transistor in common, second electrodes respectively coupled to the second electrode of the first transistor and the output terminal, and first electrodes coupled to a second prescribed voltage.

8. The level shifter of claim 7, further comprising:
second and third transistors each having a first electrode with a first prescribed voltage applied thereto and a control electrode that receives the second control signal from the comparator, and second electrodes respectively coupled to the first electrode of the first transistor and the output terminal.

9. The level shifter circuit of claim 8, wherein when the voltage from the comparator is the level up case, the second and third transistors in the second voltage shifter unit are turned off to cut off a current to the second voltage shifter.

10. The level shifter of claim 9, wherein the first and second prescribed voltages are a power source voltage and a ground voltage, and wherein the control, first and second electrodes are gate, source and drain electrodes, respectively.

11. The level shifter circuit of claim 7, wherein the first control signal is an up/down control signal that determines a level up/level down of the input voltage.

12. The level shifter circuit of claim 11, wherein the comparator compares the up/down control signal to the reference signal and provides the second control signal lower than the reference voltage if it is a level up case and higher than the reference voltage if it is a level down case.

13. The level shifter of claim 7, wherein the first and fourth transistors are NMOS type transistors and the fifth and sixth transistors are PMOS type transistors.

14. The level shifter of claim 7, wherein the third control sig amount of the leveled up signal, and wherein a fourth control signal applied to the second voltage shifter controls an amount of the leveled down signal.

15. A level shifter circuit, comprising:
- a comparator that compares a first control signal to a reference signal to generate a second control signal according to the first control signal;
- a first voltage shifter that levels up an input voltage in response to the second control signal from the comparator;
- a second voltage shifter that levels down the input voltage in response to the second control signal from the comparator; and
- a selector that selectively provides one of a leveled up signal and a leveled down signal from the first voltage shifter or the second voltage shifter, wherein the first control signal determines a level up/level down of the input voltage, and wherein the second control signal is one of higher and lower than the reference signal for the level up of the input voltage and the other of higher and lower than the reference signal for the level down of the input voltage.

16. The level shifter of claim 15, wherein a third control signal applied to the first voltage shifter controls an amount of the level up of the input voltage, and wherein a fourth control signal applied to the second voltage shifter controls an amount of the level down of the input voltage.

17. The level shifter circuit of claim 15, wherein each of the voltage shifters comprises:
- a first transistor that has a control electrode that receives the input voltage;
- a second and third transistors that each have a first electrode with a first prescribed voltage applied thereto and a control electrode that receives the second control signal from the comparator;
- a fourth transistor that has a control electrode that receives a signal that determines a switching point of the voltage shifter, a first electrode coupled to a second electrode of the second transistor, and a second electrode coupled to an output terminal in common with a second electrode of the third transistor; and
- fifth and sixth transistors that each have control electrodes coupled to a second electrode of the first transistor in common, second electrodes respectively coupled to the second electrode of the first transistor and the output terminal, and first electrodes coupled to a second prescribed voltage.

18. The level shifter circuit of claim 17, wherein for the level up of the input voltage, the second and third transistors in the second voltage shifter unit are turned off, and wherein for the level down of the input voltage, the second and third transistors in the first voltage shifter unit are turned off.

19. The level shifter circuit of claim 15, wherein the second voltage shifter is disabled for the level up of the input voltage.

* * * * *